(12) United States Patent
Unter Ecker

(10) Patent No.: US 11,202,388 B2
(45) Date of Patent: Dec. 14, 2021

(54) LIVING ROOM CONVERGENCE DEVICE

(71) Applicant: Telefonaktiebolaget LM Ericsson (publ), Stockholm (SE)

(72) Inventor: Oliver Unter Ecker, Los Angeles, CA (US)

(73) Assignee: TELEFONAKTIEBOLAGET LM ERICSSON (PUBL), Stockholm (SE)

(*) Notice: Subject to any disclaimer, the term of this patent is extended or adjusted under 35 U.S.C. 154(b) by 0 days.

(21) Appl. No.: 16/758,821

(22) PCT Filed: Oct. 30, 2018

(86) PCT No.: PCT/IB2018/058511
§ 371 (c)(1),
(2) Date: Apr. 23, 2020

(87) PCT Pub. No.: WO2019/087080
PCT Pub. Date: May 9, 2019

(65) Prior Publication Data
US 2020/0329582 A1 Oct. 15, 2020

Related U.S. Application Data

(60) Provisional application No. 62/579,007, filed on Oct. 30, 2017.

(51) Int. Cl.
*H05K 7/20* (2006.01)
*G06F 1/20* (2006.01)

(52) U.S. Cl.
CPC ......... *H05K 7/20172* (2013.01); *G06F 1/20* (2013.01); *H05K 7/20145* (2013.01); *H05K 7/20154* (2013.01)

(58) Field of Classification Search
CPC ........... H05K 7/20172; H05K 7/20145; H05K 7/20154; H05K 7/20736; H05K 7/20209;
(Continued)

(56) References Cited

U.S. PATENT DOCUMENTS

D216,122 S 11/1969 Linden et al.
D346,170 S 4/1994 Tang
(Continued)

FOREIGN PATENT DOCUMENTS

CN 104965575 A 10/2015
CN 204965314 U 1/2016
(Continued)

OTHER PUBLICATIONS

Amazon Echo Input Portable Edition, announced Dec. 23, 2019 [online], [retrieved Aug. 14, 2020], Available from Internet, URL <https://www.indiatoday.in/technology/reviews/story/amazon-echo-input-portable-edition-smart-speaker-review-1630946-2019-12-23> (Year: 2019), 13 pages.
(Continued)

*Primary Examiner* — Mandeep S Buttar
(74) *Attorney, Agent, or Firm* — Nicholson De Vos Webster & Elliott LLP

(57) ABSTRACT

A living room convergence device includes a case, a mainboard, a central processor, and a thermal solution. The case includes a bottom portion that includes air intake holes and a top portion that includes air exhaust holes. The thermal solution includes a heatsink sitting atop the mainboard of the living room convergence device, the heatsink to dissipate heat from the central processor. The thermal solution also includes a fan assembly including rotating fan blades and a motor that drives the rotating fan blades, creating a bottom-to-up swirling airflow starting from the air intake holes and exiting through the air exhaust holes.

17 Claims, 12 Drawing Sheets

(58) Field of Classification Search
CPC ........... G06F 1/20; G06F 1/203; G06F 1/181; G06F 2200/201; H01L 23/467; H01L 23/3672; H01L 21/4871; F04D 19/002; F04D 29/325; F04D 25/166
USPC ..... 361/695, 697, 704, 679.48, 679.54, 689, 361/709; 257/E23.099, E23.103, 722; 165/80.3, 104.33, 80.2
See application file for complete search history.

(56) References Cited

U.S. PATENT DOCUMENTS

| | | | |
|---|---|---|---|
| D391,943 S | 3/1998 | Han | |
| 6,160,680 A | 12/2000 | Beuch et al. | |
| 6,459,577 B1* | 10/2002 | Holmes | G06F 1/20 |
| | | | 165/80.3 |
| D492,279 S | 6/2004 | Lee | |
| D521,983 S | 5/2006 | Kuo | |
| D557,682 S | 12/2007 | Oas | |
| D609,213 S | 2/2010 | Yeo | |
| D612,361 S | 3/2010 | Wright | |
| D633,231 S | 2/2011 | Morrison | |
| D638,001 S | 5/2011 | Nakhjiri et al. | |
| D683,636 S | 6/2013 | Levanen | |
| D694,463 S | 11/2013 | Sieczkowski | |
| D700,904 S | 3/2014 | Miller et al. | |
| D704,177 S | 5/2014 | Chun et al. | |
| D725,088 S | 3/2015 | Kwak et al. | |
| D728,525 S | 5/2015 | Zhang | |
| D734,740 S | 7/2015 | Erbeus | |
| D739,397 S | 9/2015 | Akana et al. | |
| D742,359 S | 11/2015 | Zhao | |
| D752,024 S | 3/2016 | Kachwalla | |
| D757,014 S | 5/2016 | Hahn et al. | |
| D766,844 S | 9/2016 | Turksu et al. | |
| D768,114 S | 10/2016 | Hou | |
| D778,871 S | 2/2017 | Corval | |
| D784,412 S | 4/2017 | Akana et al. | |
| D789,373 S | 6/2017 | King | |
| D793,363 S | 8/2017 | Zhang | |
| D797,704 S | 9/2017 | Fischer et al. | |
| D798,490 S | 9/2017 | Haines et al. | |
| 9,793,869 B1 | 10/2017 | Snyder et al. | |
| D802,022 S | 11/2017 | Yao et al. | |
| D808,389 S | 1/2018 | Judge et al. | |
| D809,951 S | 2/2018 | Yang et al. | |
| D810,137 S | 2/2018 | Tsang et al. | |
| D812,577 S | 3/2018 | Turksu et al. | |
| D813,273 S | 3/2018 | Mecchella et al. | |
| D820,318 S | 6/2018 | Mullins et al. | |
| 10,034,411 B2* | 7/2018 | Prather | H05K 7/20154 |
| D825,539 S | 8/2018 | Lu et al. | |
| 10,043,527 B1* | 8/2018 | Gurijala | G10L 19/018 |
| D830,870 S | 10/2018 | Shepher | |
| D834,567 S | 11/2018 | Snyder et al. | |
| D839,189 S | 1/2019 | Miller et al. | |
| D840,436 S | 2/2019 | Demin et al. | |
| D845,258 S | 4/2019 | D'Ambrosio | |
| D846,418 S | 4/2019 | Tao | |
| D852,229 S | 6/2019 | Akana et al. | |
| D855,040 S | 7/2019 | Fu et al. | |
| D859,335 S | 9/2019 | D'Ambrosio et al. | |
| D859,364 S | 9/2019 | Chalabi et al. | |
| D862,417 S | 10/2019 | Chalabi et al. | |
| D862,418 S | 10/2019 | Distefano | |
| D864,162 S | 10/2019 | Peterson et al. | |
| D864,930 S | 10/2019 | Bould et al. | |
| D866,518 S | 11/2019 | Ding | |
| D873,799 S | 1/2020 | Longenecker | |
| D883,329 S | 5/2020 | Shi et al. | |
| D884,677 S | 5/2020 | Feng | |
| D885,367 S | 5/2020 | Guo et al. | |
| D888,687 S | 6/2020 | Xu et al. | |
| D888,688 S | 6/2020 | Xie | |
| D894,963 S | 9/2020 | Li | |
| D914,662 S | 3/2021 | Unter Ecker | |
| 2005/0182980 A1* | 8/2005 | Sutardja | G06F 1/3293 |
| | | | 713/320 |
| 2009/0004003 A1 | 1/2009 | Hsiao et al. | |
| 2013/0028457 A1 | 1/2013 | Yeh et al. | |
| 2013/0088818 A1* | 4/2013 | Yamaguchi | C09J 7/26 |
| | | | 361/679.01 |
| 2014/0192997 A1* | 7/2014 | Niu | H04R 3/005 |
| | | | 381/92 |
| 2014/0362522 A1* | 12/2014 | Degner | G06F 1/182 |
| | | | 361/679.47 |
| 2015/0078006 A1 | 3/2015 | Hu et al. | |
| 2015/0223354 A1* | 8/2015 | Olsen | F16M 11/10 |
| | | | 248/458 |
| 2017/0317655 A1* | 11/2017 | Snyder | G01D 5/3473 |
| 2018/0109860 A1* | 4/2018 | Mau | H04R 9/025 |

FOREIGN PATENT DOCUMENTS

| | | |
|---|---|---|
| CN | 206421318 U | 8/2017 |
| CN | 305515959 S | 12/2019 |
| EM | DM/200 610 | 11/2018 |
| GB | 6093531 | 6/2020 |
| IN | 303056-0001 | 7/2019 |
| KR | 30-1064182 | 6/2020 |
| WO | 2014197731 A1 | 12/2014 |
| WO | D200610-001 | 11/2018 |
| WO | D203968-001 | 4/2019 |

OTHER PUBLICATIONS

Red Dot award, first available Apr. 6, 2017 [online], [retrieved Aug. 14, 2020], Available from Internet, URL: <https://www.ericsson.com/en/news/2017/4/red-dot-award-to-five-ericsson-products> (Year: 2017), 7 pages.
Shower Bluetooth Speaker, announced 2019 [online], [retrieved Aug. 14, 2020], Available from Internet, URL: <https://www.sunnylife.com/products/shower-bluetooth-speaker-electric-bloom-navy-blue?gclid=CjOKCQjw7Nj5BRCZARIsABwxDKIeZcQmbZN_WwjwfVNgh3RYMRzqipLgnQ6CZ5UakrPLoV77tySFQaAqrgEALw_wcB> (Year:2020), 1 page.
Sony SRS-XB23 Extra Bass, first available May 11, 2020 [online], [retrieved Aug. 14, 2020], Available from Internet, URL:<https://www.amazon.com/Sony-SRS-XB23-EXTRA-BASS-inal%C3%A1mbrico/dp/B086DDP55B/ref=sr_1_3dchild=1&keywords=sony%2Bportable%2Bspeaker&qid=1597513019&sr=8-3&th=1> (Year: 2020), 7 pages.
SoundRing wireless speaker, announced Sep. 22, 2014 [online], [retrieved Aug. 14, 2020], Available from Internet, URL: <https://www.usa.philips.com/c-p/DS3881W_37/fidelio-soundring-wireless-speaker> (Year: 2014), 5 pages.
International Search Report and Written Opinion for PCT/IB2018/058511, dated Feb. 12, 2019, 21 pages.
Bond Home Review, announced 2018 [online], [retrieved Nov. 20, 2020] Available from Internet, URL: <https://thesmartcave.com/bond-home-review/> (Year: 2018).
CareDot Oversized Emergency Button, announced Sep. 6, 2019 [online], [retrieved Aug. 25, 2020] Available from Internet, URL: <https://thegadgetflow.com/portfolio/oversized-emergency-button/> (Year: 2019).
Sunbeam Fpsbdml920 Full Size Donut Maker, announced Oct. 31, 2010 [online], [retrieved Nov. 20, 2020] Available from Internet, URL:<https://www.amazon.com/Sunbeam-Fpsbdml920-Full-Donut-Maker/dp/B003TSB4M8> (Year: 2010).
Intention to Grant, EP App. No. 18807707.7, dated Jul. 9, 2021, 6 pages.

\* cited by examiner

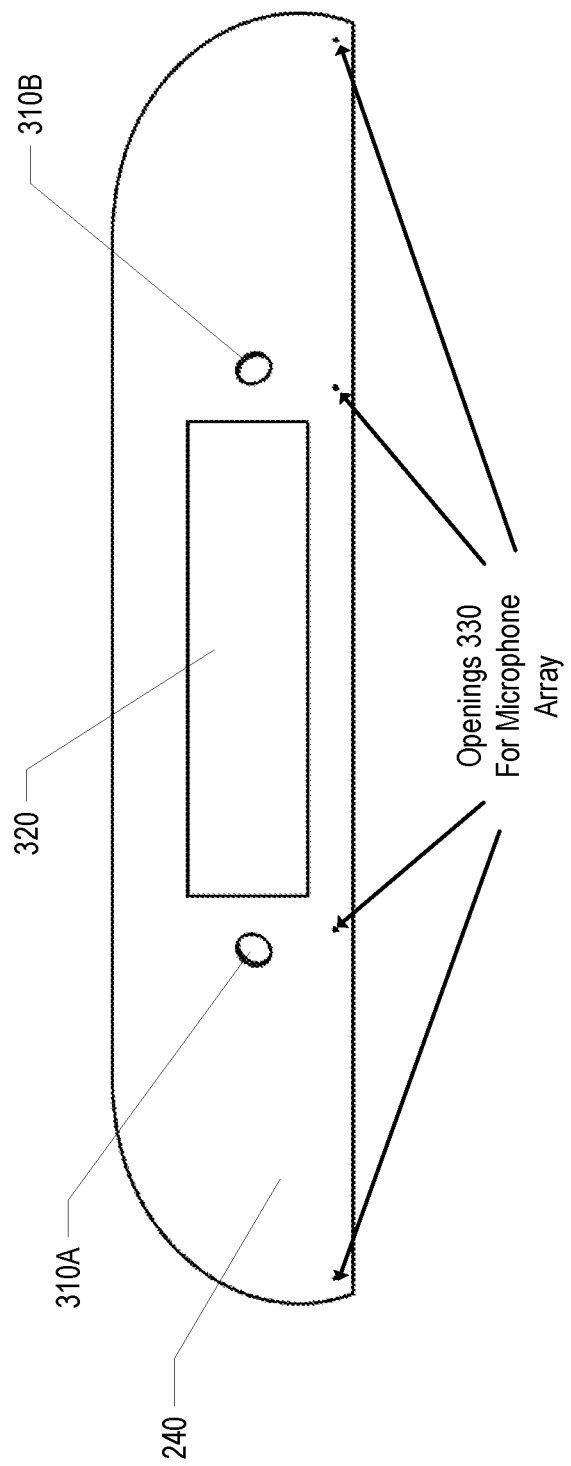

LIVING ROOM CONVERGENCE DEVICE

CROSS-REFERENCE TO RELATED APPLICATIONS

This application is a National stage of International Application No. PCT/IB2018/058511, filed Oct. 30, 2018, which claims the benefit of U.S. Provisional Application No. 62/579,007, filed Oct. 30, 2017, which are hereby incorporated by reference.

TECHNICAL FIELD

Embodiments of the invention relate to the field of media devices; and more specifically, to a living room convergence device.

BACKGROUND ART

Modern living room media consumption experiences—consisting mostly of media watching and gaming—are realized through gaming consoles, streaming devices, and set-top boxes connected to TVs, and Smart TVs. In addition, and increasingly, connected speaker, home hub, and other devices enabling Internet-of-Things (IoT) and Artificial Intelligence (AI) use cases are finding their way into this space.

There currently exist certain challenge(s). For the most part, individual devices do independent jobs in the living room. For example, gaming consoles are predominantly used for gaming, set-top boxes (STBs) are predominantly used for watching TV, and connected speakers are predominantly used for cloud AI-powered voice queries & responses and music playback control. Certain aspects of the present disclosure and their embodiments may provide solutions to these or other challenges.

SUMMARY

A living room convergence device includes a case, a mainboard, a central processor, and a thermal solution according to an embodiment. The case includes a bottom portion that includes a plurality of air intake holes, and a top portion that includes a plurality of air exhaust holes. The thermal solution includes a heatsink sitting atop the mainboard to dissipate heat from the central processor. The thermal solution also includes a fan assembly including rotating fan blades and a motor that drives the rotating fan blades, creating a bottom-to-up swirling airflow starting from the plurality of air intake holes and exiting through the plurality of air exhaust holes. In an embodiment, the heatsink is oversized as compared to what is typically used for an equivalent thermal design power of the central processor.

In an embodiment, the mainboard is suspended from the top portion of the case. In an embodiment, the bottom portion of the case is replaceable. Alternatively, or additionally, the bottom portion of the case is removable to allow access to one or more components of the mainboard for upgrading and/or servicing. In an embodiment, the bottom portion and the top portion of the case are magnetically connected.

In an embodiment, the rotating fan blades of the thermal solution are shaped to scoop air up from the plurality of air intake holes and push upwards to the plurality of air exhaust holes. In an embodiment, the rotating fan blades of the thermal solution cause lateral air flow over the heatsink. In an embodiment, the heatsink is cradled within the rotating fan blades.

In an embodiment, the motor drives a fan belt around a ring holding the rotating fan blades to cause the rotation of the rotating fan blades.

In an embodiment, a ratio of radii between the rotating fan blades and the ring permits slow rotation speeds as compared to a direct-drive fan.

In an embodiment, the living room convergence device further includes one or more expansion slots, according to an embodiment. The living room convergence device further may include a microphone array.

In an embodiment, the living room convergence device further includes an always-on compute subsystem with a VPU, and camera and microphone interfaces.

In an embodiment, the living room convergence device includes an induction coil for inductive charging of an external device.

In an embodiment, the living room convergence device includes a display, which may be a horizontally-bendable display.

In an embodiment, the living room convergence device further includes a Wi-Fi router for Wi-Fi connectivity and/or a radio module for cellular connectivity.

In an embodiment, the living room convergence device includes a rubber foot ring (250) connected to the bottom portion (215) of the case (200), and a rubber ring between the bottom portion (215) of the case (200) and the top portion (240) of the case (200).

BRIEF DESCRIPTION OF THE DRAWINGS

The invention may best be understood by referring to the following description and accompanying drawings that are used to illustrate embodiments of the invention. In the drawings:

FIG. 5 shows a front view of the case top of the living room convergence device according to an embodiment.

DETAILED DESCRIPTION

Figure 1:
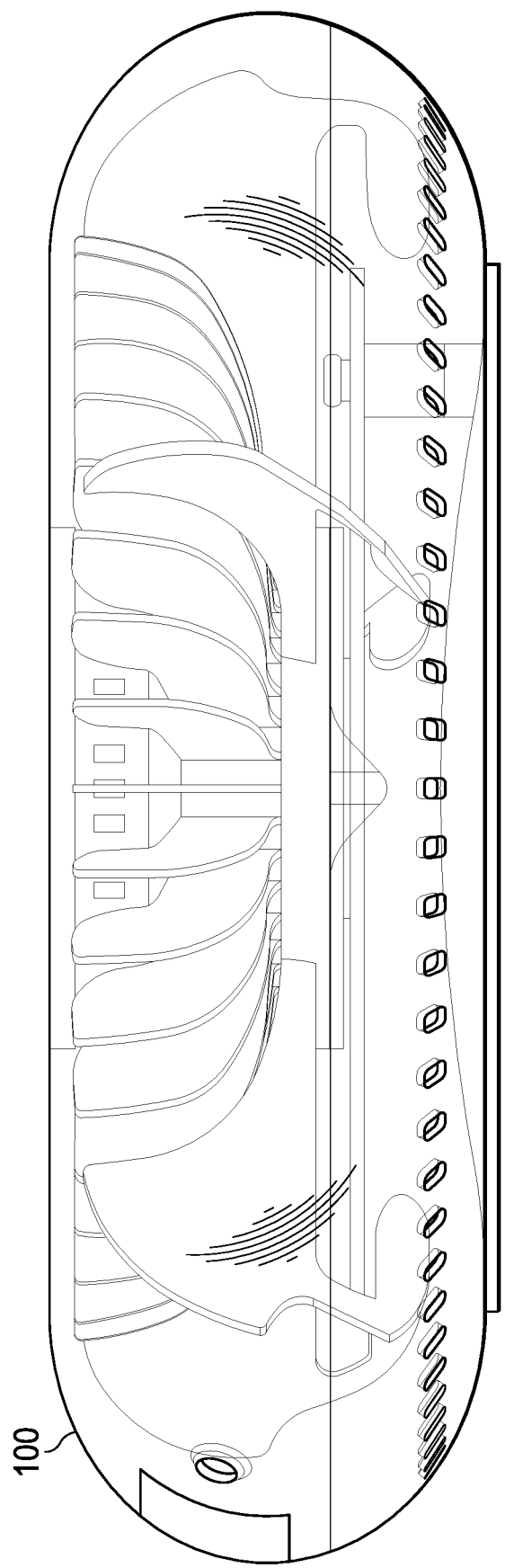
FIG. 1 shows a cross section of the living room convergence device that shows all components, according to an embodiment.

A living room convergence device is described. The living room convergence device has a unique design. The living room convergence device carries out multiple living room media functions (e.g., TV, gaming, always-on IoT/home/AI hub) in one machine. In addition, it solves some of the problems associated with the predominantly closed devices currently used for these functions and may be both configurable and upgradable (unlike these devices). The living room convergence device has a unique industrial design that supports a) the various functions, b) upgradability, and/or c) quietness of the machine.

The essence of the solution is to combine various living room entertainment device use functions into one device and have that device A) perform quietly under three usage scenarios that have different power consumption profiles, and optionally B) be upgradable. The properties A and B are realized through a novel thermal solution and accompanying new and strongly-differentiated industrial design.

The new living room convergence device may include a new thermal solution that optimizes a media device's low-CPU utilization use case (streaming media) that occurs most of the time. The new thermal solution may combine an oversized heat sink with a very slow speed but high air volume-moving fan, whose blades' shape is novel.

The new living room convergence device may, alternatively or additionally, include a new case design that exploits natural convection of heat. The new case design may, alternatively or additionally, afford cameras a wide view into the living room without placing them at an angle. The new case design may, alternatively or additionally, support a microphone array covering a living room. The new case design may, alternatively or additionally, hide all connectors and allow operation with no visible cables when paired with a suitable media cabinet.

The new living room convergence device may, alternatively or additionally, include a suspended mainboard feature. The suspended mainboard feature may enable a media device's separation into inaccessible and accessible & upgradable partitions.

The new living room convergence device may, alternatively or additionally, include a suspended mainboard and replaceable case bottom feature that enables significant hardware upgrades that augment the shape of the case, at low cost.

The solution may include a method to fit a one-dimensionally bendable display into a two-dimensionally curved surface.

There are, proposed herein, various embodiments which address one or more of the issues disclosed herein.

Certain embodiments may provide one or more of the following technical advantage(s). The new living room convergence device unifies and enhances the media consumption experience and delights users, while also saving cost. For example, the following one or more functions may be unified with the device—gaming, live TV watching, media streaming, voice control, video calling, IoT/home hub, and compute node for edge compute service. The living room convergence device may be upgradable in respect to memory, persistent storage space, and/or graphics or AI compute capability. This, together with a mechanical storage device-free system design, increases the longevity (and long-term user satisfaction) of the solution.

The industrial design of the living room convergence device is unique in various aspects, such as the overall appearance, configurability/upgradability, and thermal solution of the living room convergence device.

The thermal solution is built for very low noise and is quieter than devices (e.g., gaming consoles, STBs) with comparable compute power, while being inexpensive to manufacture. Moreover, the thermal solution is designed to have specific solutions for three identified use cases: always-on abilities, media streaming, and gaming Each of these solutions has their own power consumption requirements. The thermal solution is completely silent, near silent, "super quiet" (according to ISO 7779) in those scenarios, respectively.

The overall appearance of the living room convergence device, which is round and shaped like a donut or red blood cell, directly supports the thermal solution and the camera, display, and microphone-array options used for some of the functions.

In summary, the advantages of the solution are that it consolidates multiple devices into one, and that it offers greater functionality than individual or combined devices, along with faster performance and quieter operation, at a cost no higher than that of a mainstream gaming console.

Some of the embodiments contemplated herein will now be described more fully with reference to the accompanying drawings. Other embodiments, however, are contained within the scope of the subject matter disclosed herein, the disclosed subject matter should not be construed as limited to only the embodiments set forth herein; rather, these embodiments are provided by way of example to convey the scope of the subject matter to those skilled in the art.

The solution realizes a living room convergence device. Although the term "living room convergence device" is used herein, the device may be used in other rooms or in other ways in addition to being used in the living room. The living room convergence device is a computer that can be used for media streaming and/or gaming and may include always-on voice and computer vision and network functionality. The living room convergence device includes a novel thermal solution. The novel thermal solution includes a heatsink and rotating fan blades. The living room convergence device includes one or more of the following hardware components:
  a PCBA with an "APU" central processor (a combination of CPU and GPU);
  internal, but user-accessible and user-serviceable, expansion slots for random-access memory (RAM), solid-state drive (SSD), graphics processing unit (GPU), universal serial bus (USB;
  a flexible wide aspect-ratio display;
  two cameras;
  a microphone array of 4 (or more) microphones;
  an always-on compute subsystem (e.g., an ARM subsystem) with VPU and camera and microphone interfaces;
  an induction coil for inductive charging of an external device, such as a phone;

a Wi-Fi router (e.g., a Mesh Wi-Fi router); and a radio module (e.g., a 4G LTE Advanced or 5G radio module).

The design of the case directs air flow and vibration in a way that minimizes noise, exploits natural convection, and minimizes vibrations from the fan to the surface the device is resting on.

In an embodiment, the living room convergence device includes only a single fan (it does not include a separate system fan and CPU fan).

FIG. 1 shows a cross section of the living room convergence device 100 that shows all components, according to an embodiment. The case of the living room convergence device 100 appears translucent in FIG. 1 for explanative purposes.

Figure 2:
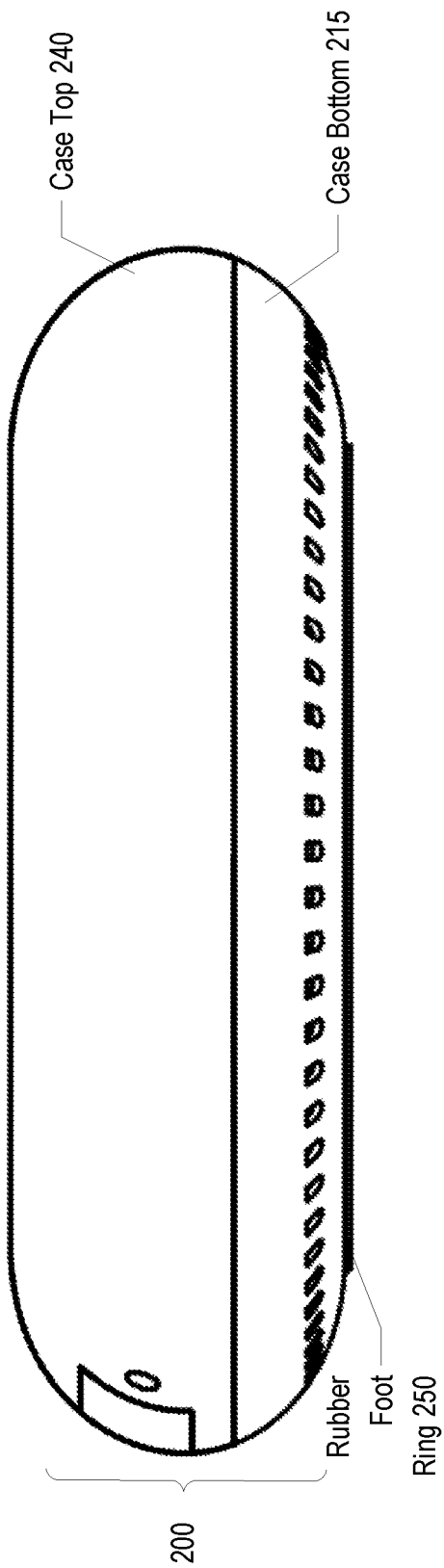
FIG. 2 shows the case of the living room convergence device according to an embodiment.

FIG. 2 shows the case 200 of the living room convergence device 100 according to an embodiment. The case 200 has a top portion (the case top 240) and a bottom portion (the case bottom 215). The case bottom 215 includes a rubber foot ring 250. The rubber foot ring 250 reduces vibration, as will be described in greater detail later herein. Although not illustrated in FIG. 2, in an embodiment there is a rubber ring between the case top 240 and the case bottom 215 that also reduces vibration. The case top 240 and the case bottom 215 may be held together magnetically in an embodiment.

Figure 4:
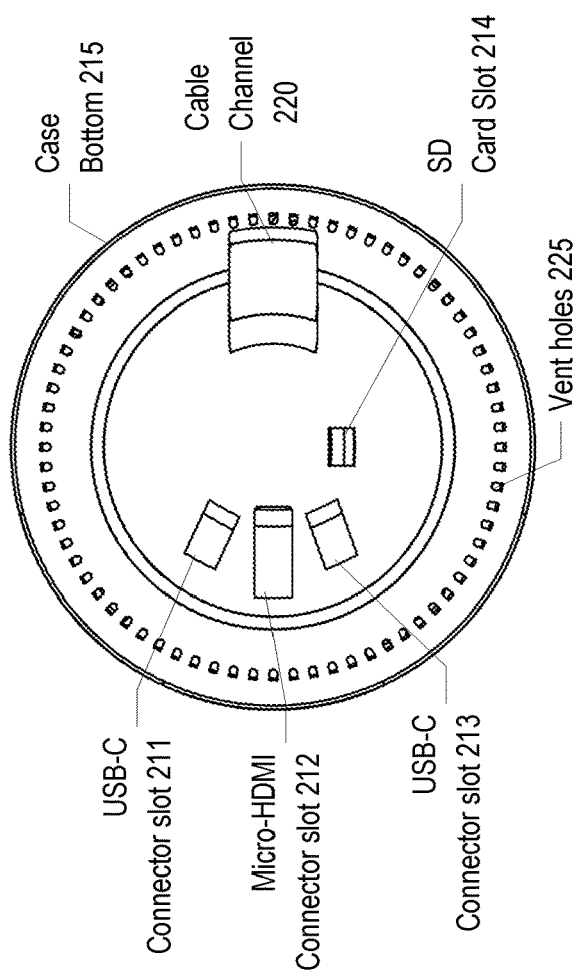
FIG. 4 shows a bottom view of the case of the living room convergence device according to an embodiment.
Figure 3:
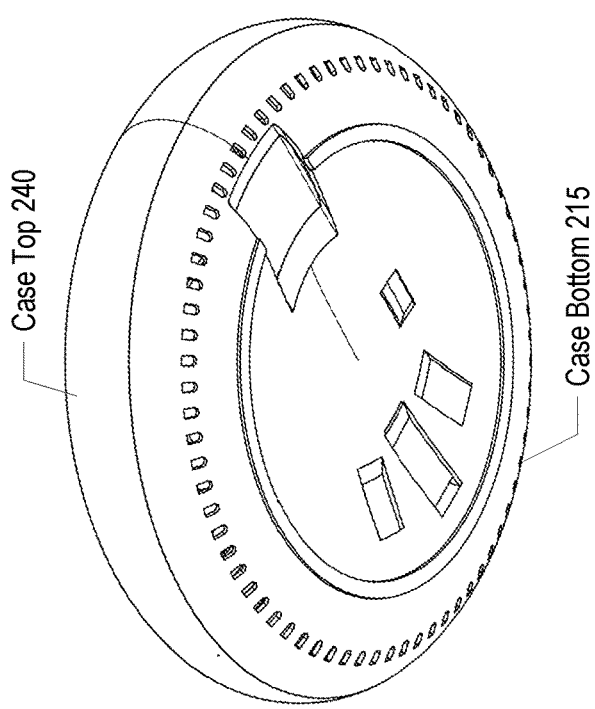
FIG. 3 shows a perspective view of the case of the living room convergence device according to the embodiment.

FIG. 3 shows a perspective view of the case 200 of the living room convergence device 100 according to the embodiment, and FIG. 4 shows a bottom view of the case 200 of the living room convergence device 100. As shown in FIGS. 3 and 4, the case bottom 215 includes one or more slots for connectors that are sunk into the case bottom 215 of the living room convergence device 100. For example, the slot 211 is a USB-C connector slot, the slot 212 is a micro-HDMI connector slot, the slot 213 is a USB-C connector slot, and the slot 214 is an SD card slot. Inserted plugs protrude into the vacancy in the center of the case bottom 215, just enough to be pulled with a thumb and index finger. Connectors are not visible from the outside. If routed straight down into an opening of a suitable cabinet (or similar) that the living room convergence device 100 is sitting on, no cables are visible at all from the outside. Otherwise, 1, 2, or 3 cables exit the unit through a cable channel 220. Vent holes 225 are air intake holes at the bottom of the living room convergence device 100 and are located around the circumference of the case bottom 215. Each vent hole 225 is not labeled in FIG. 4 to not obscure understanding of the drawing.

Figure 7:
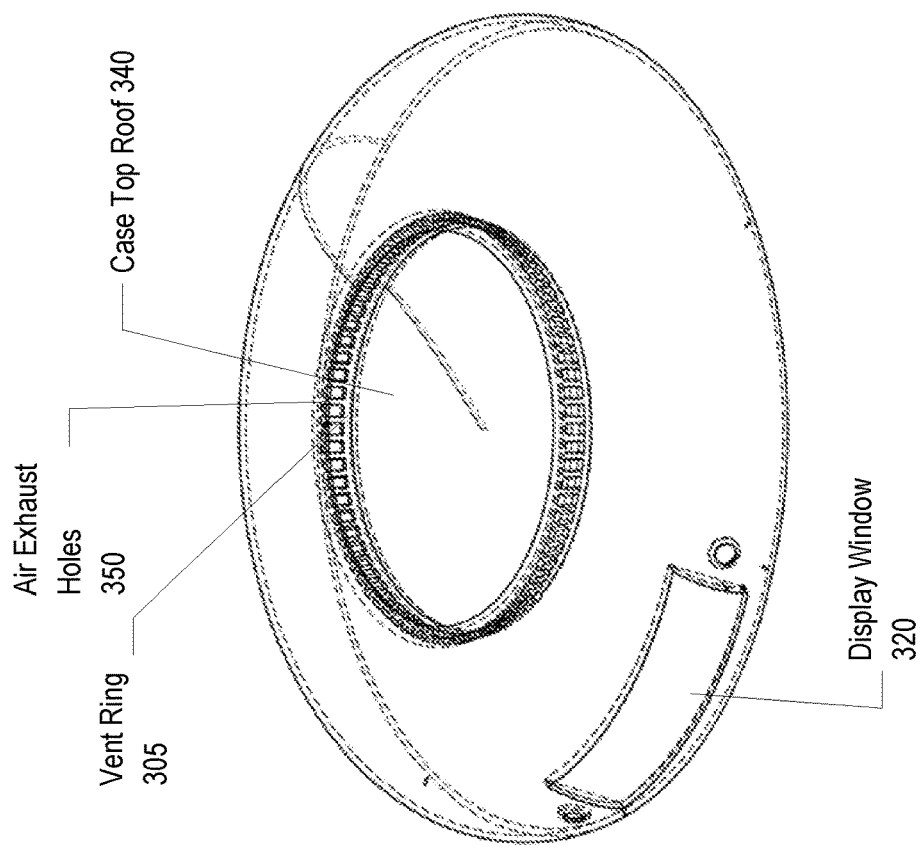
FIG. 7 shows a perspective view of the case top of FIG. 5 according to an embodiment.
Figure 6:
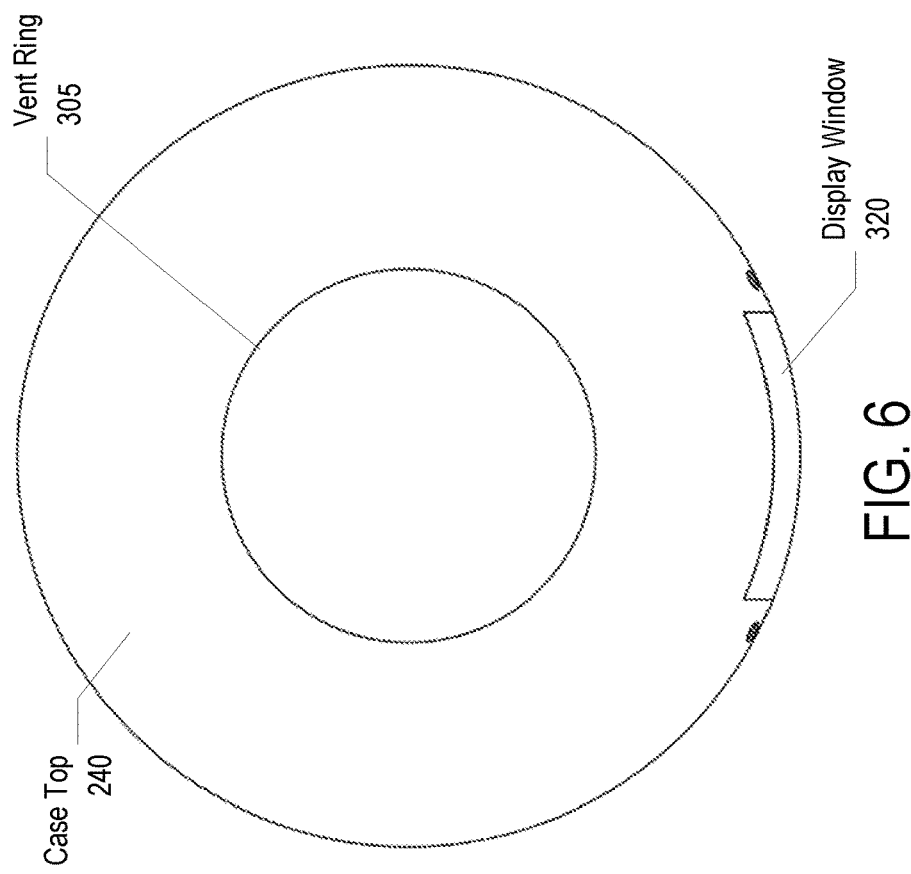
FIG. 6 shows a top view of the case top of FIG. 5 according to an embodiment.

FIG. 5 shows a front view of the case top 240 of the living room convergence device 100 according to an embodiment. The case top 240 includes openings 310A-B for two cameras respectively, and openings 330 for a microphone array (e.g., four microphones). The angle between microphones (e.g., 50 degrees) is calculated such as to evenly cover the hemisphere in front of the living room convergence device 100. A display 320, which may be horizontally bendable, is fitted between the cameras. The display 320 may be curved in the X-axis and flat in the Z-axis. A clear substrate fill-in between the display 320 and the cast top 300 levels the vertical curvature of the case top 300 for flush mounting. FIG. 6 shows a top view of the case top 240 of FIG. 5, and FIG. 7 shows a perspective view of the case top 240 of FIG. 5. FIGS. 6 and 7 show that the case top 240 includes a vent ring 305 that includes vents for exiting air (the air exhaust holes 350) that are located around the circumference of the case top roof 340. Each air exhaust hole 350 is not labeled in FIG. 7 to not obscure understanding of the drawing.

Figure 9:
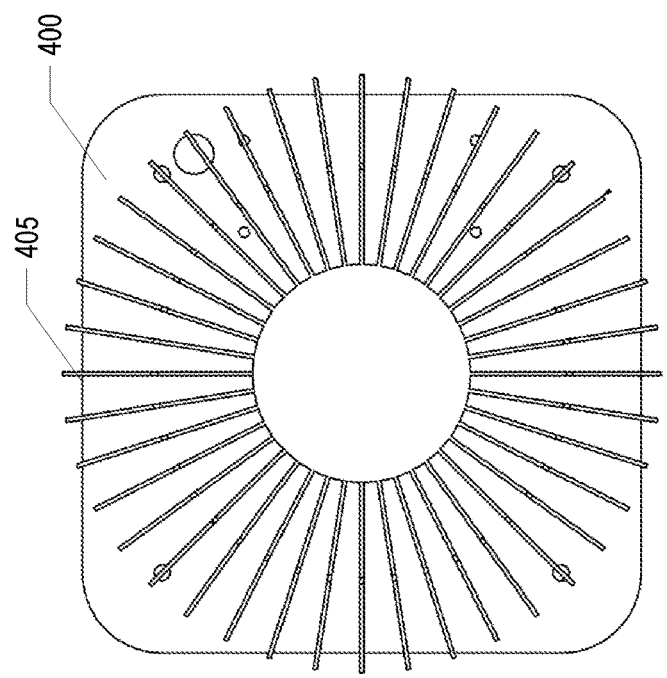
FIG. 9 shows a top view of the heatsink sitting atop the mainboard of FIG. 8 according to an embodiment.
Figure 8:
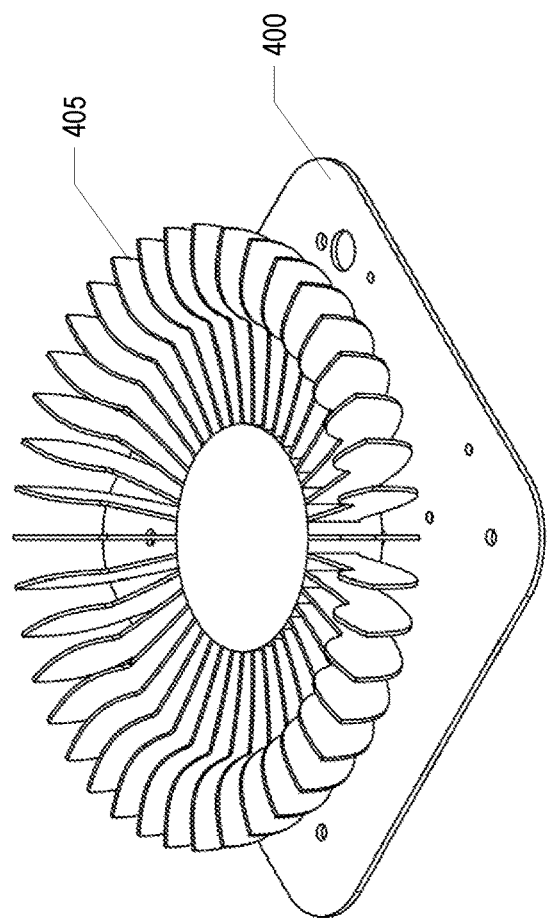
FIG. 8 shows a perspective view of the heatsink sitting atop the mainboard of the living room convergence device according to an embodiment.
Figure 10:
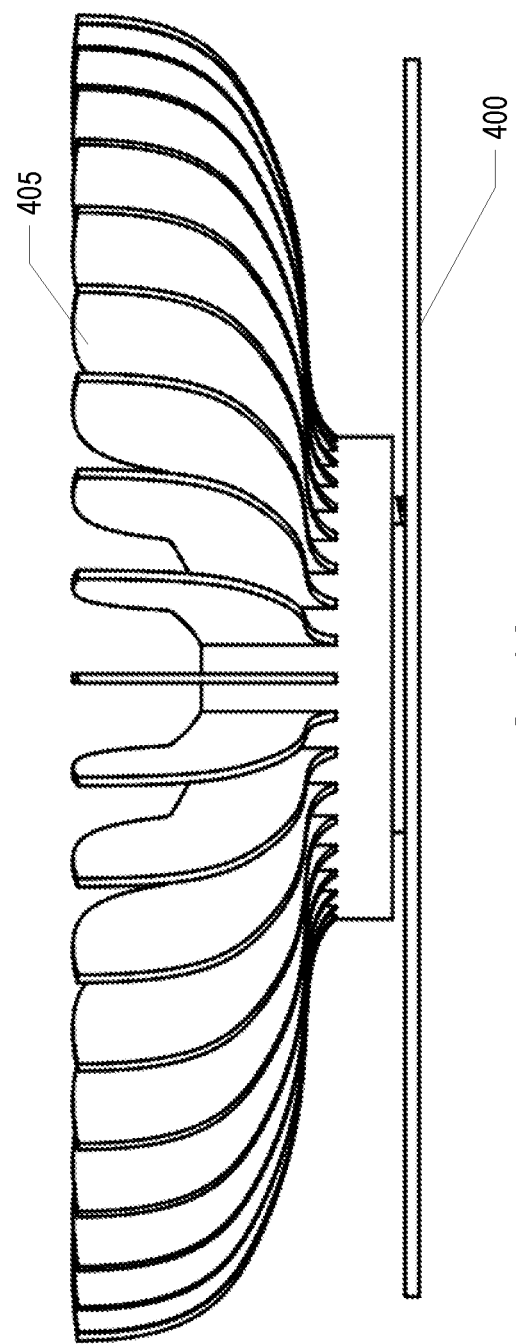
FIG. 10 shows a front view of the heatsink sitting atop the mainboard of FIG. 8 according to an embodiment.

FIG. 8 shows a perspective view of the heatsink 405 sitting atop the mainboard 400 of the living room convergence device 100 according to an embodiment. FIG. 9 shows a top view of the heatsink 405 sitting atop the mainboard 400 according to an embodiment. FIG. 10 shows a front view of the heatsink 405 sitting atop the mainboard 400 according to an embodiment. In an embodiment, the heatsink 405 is floral shaped with fins extending from the center of the heatsink 405. The fins may be substantially perpendicular to the processor of the living room convergence device 100. The heatsink 405 is form-fitting with the case of the living room convergence device 100 and sized larger than customarily for the thermal design power (TDP) of the processor of the living room convergence device 100. In an embodiment, the heatsink 405 is 3-4 times larger (e.g., in size and weight) than what is typically used for an equivalent TDP. The oversize of the heatsink 405 maximizes heat storage and dissipation capacity, which allows the accompanying fan to rotate slowly (in customary terms). For instance, many traditional CPU fans (used with relatively smaller heatsinks) operate relatively fast and at the speed of a direct driven electric motor (e.g., 1000 RPM); whereas the accompanying fan described herein (used with a relatively larger heatsink) operates slowly in typical conditions (e.g., 100 RPM). For instance, when the processor is at about 20% load, which it is in the estimated 80% of the time use case of streaming media (vs. gaming, which produces full load), the accompanying fan may turn more slowly than a traditional fan.

Figure 12:
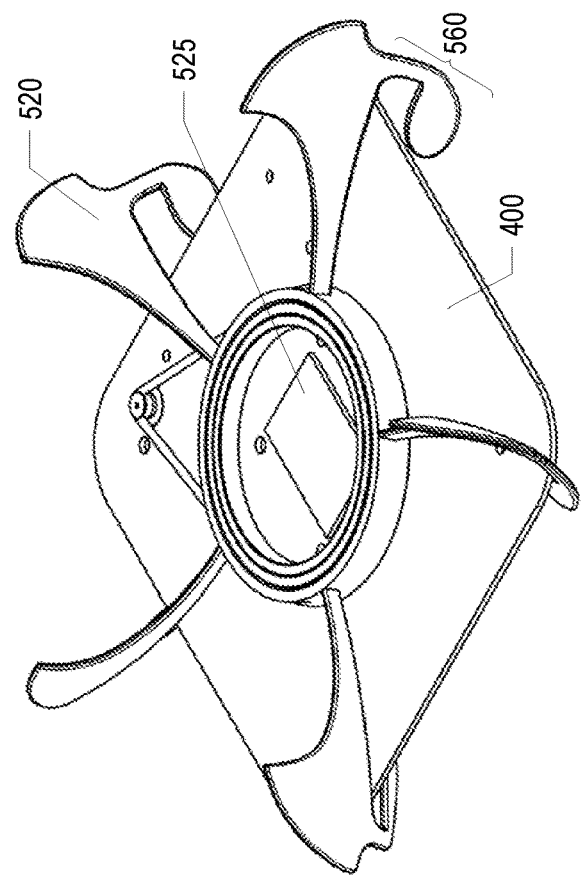
FIG. 12 shows a perspective view of the fan assembly atop the mainboard of FIG. 11 according to an embodiment.
Figure 11:
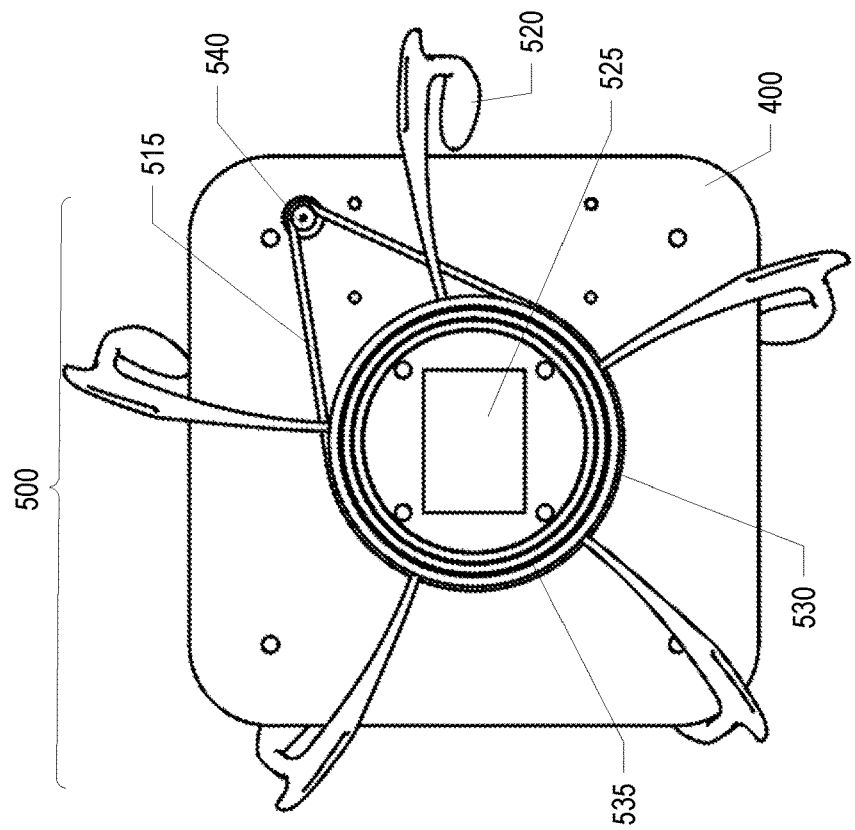
FIG. 11 shows a top view the fan assembly atop the mainboard of the living room convergence device according to an embodiment.
Figure 13:
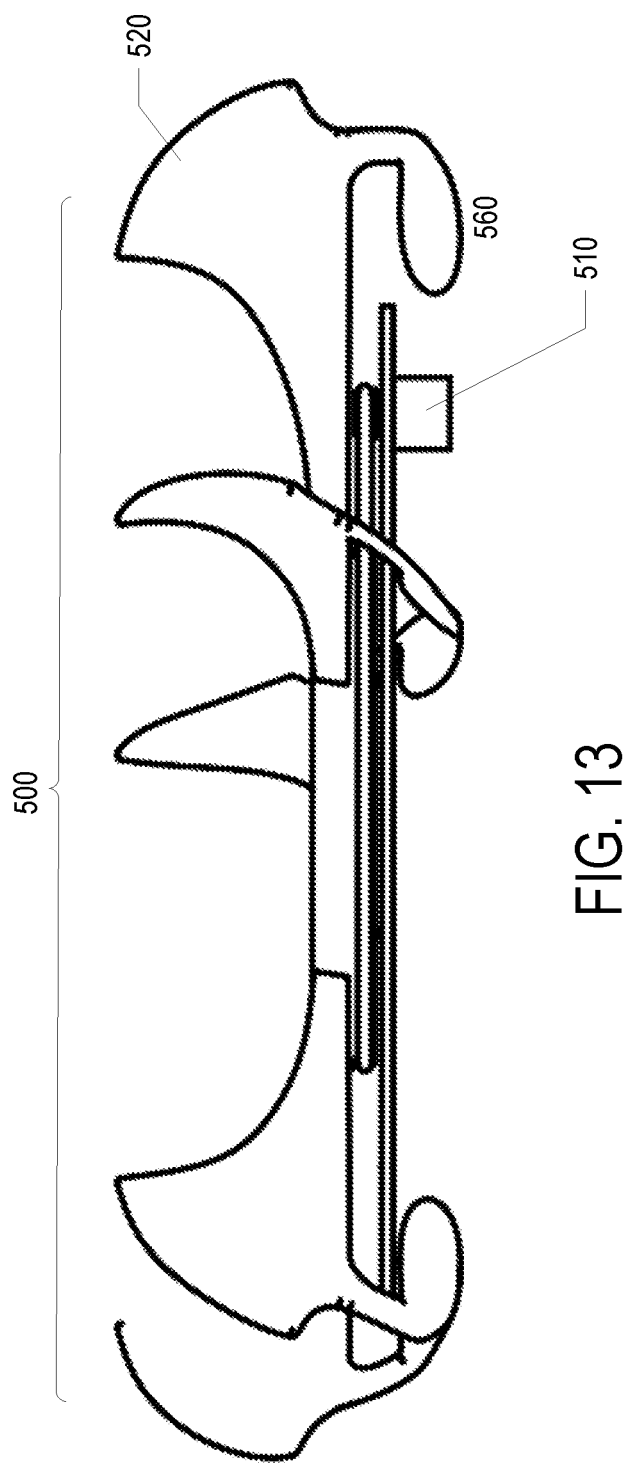
FIG. 13 shows a front view of the fan assembly atop the mainboard of FIG. 11 according to an embodiment.

FIG. 11 shows a top view the fan assembly 500 atop the mainboard 400 of the living room convergence device 100 according to an embodiment. FIG. 12 shows a perspective view of the fan assembly atop the mainboard 400 of FIG. 11 according to an embodiment. FIG. 13 shows a front view of the fan assembly atop the mainboard 400 of FIG. 11 according to an embodiment. The rotating fan blades 520 are substantially perpendicular to the central processor 525. Driven by a motor 510 and an o-ring belt 515 around the fan motor bushing 540 and the ring 530, the fan assembly 500 implements a mechanism to revolve the rotating fan blades 520 around the central processor 525. Thus, unlike typical CPU fans that either push air down onto the CPU and/or accompanying heatsink or suck air directly from the CPU and/or accompanying heatsink, the rotating fan blades 520 are rotated in such a way to create a swirling airflow. The rotating fan blades 520 are held by the ring 530 that sits around a large diameter ball bearing 535. The shape of the rotating fan blades 520 is calculated such as to create a bottom-to-up, swirling airflow. The rotating fan blades 520 scoops air up at the bottom air intake holes 225 and swirls the air toward the top vent ring 305, while causing lateral air flow over the heatsink 405 which is cradled within the blades 520. The large ratio of radii between blade and motor rings (of approx. 10:1), permits very slow rotation speeds, in comparison to the direct-drive of a regular fan. This allows the fan to be more silent than typical fans. The fan is a high-volume, but slow-moving fan, that recycles the entire air volume of the living room convergence device 100 in a few revolutions. This permits a slow fan and thereby reduces the noise of the fan thereby realizing a quiet thermal solution.

In a scenario where the living room convergence device 100 is in a hibernating mode (e.g., an "always-on" mode) where a compute subsystem (e.g., an ARM subsystem) is still on such that the living room convergence device 100 can be turned on (e.g., via voice, face, etc.), the thermal solution is completely silent because the fan does not turn on. In a scenario where the living room convergence device 100 is operating at about 20% load (which occurs, for example, if the living room convergence device 100 is only streaming media), the thermal solution is near silent (according to ISO 7779) because the fan will turn relatively slow (e.g., around 100 RPM as opposed to 500-100 RPMs of a traditional CPU fan). In a scenario where the living room convergence device 100 is operating at near full load (e.g., such as if used for gaming), the thermal solution is super quiet (according to ISO 7779) because the fan is still turning relatively slow (e.g., about a tenth of the speed of a regular CPU fan).

The blades 520 are in a scoop shape where a lower portion 560 of each blade 520 wraps around the mainboard 400. In another embodiment, the fan blades are not in a scoop shape and do not include a lower portion that wraps around the mainboard 400.

The design of the living room convergence device 100 reduces vibration. In an embodiment, there are dampening elements that dampen the vibration in which vibrations from the fan must travel through, including one or more of: the minimal surface-shaped case top's inner ring to the outer circumference, a rubber ring between the case top and the case bottom, the case bottom, and the rubber foot ring 250, before reaching the surface the device is resting on. This minimizes transmitted device vibrations.

Figure 14:
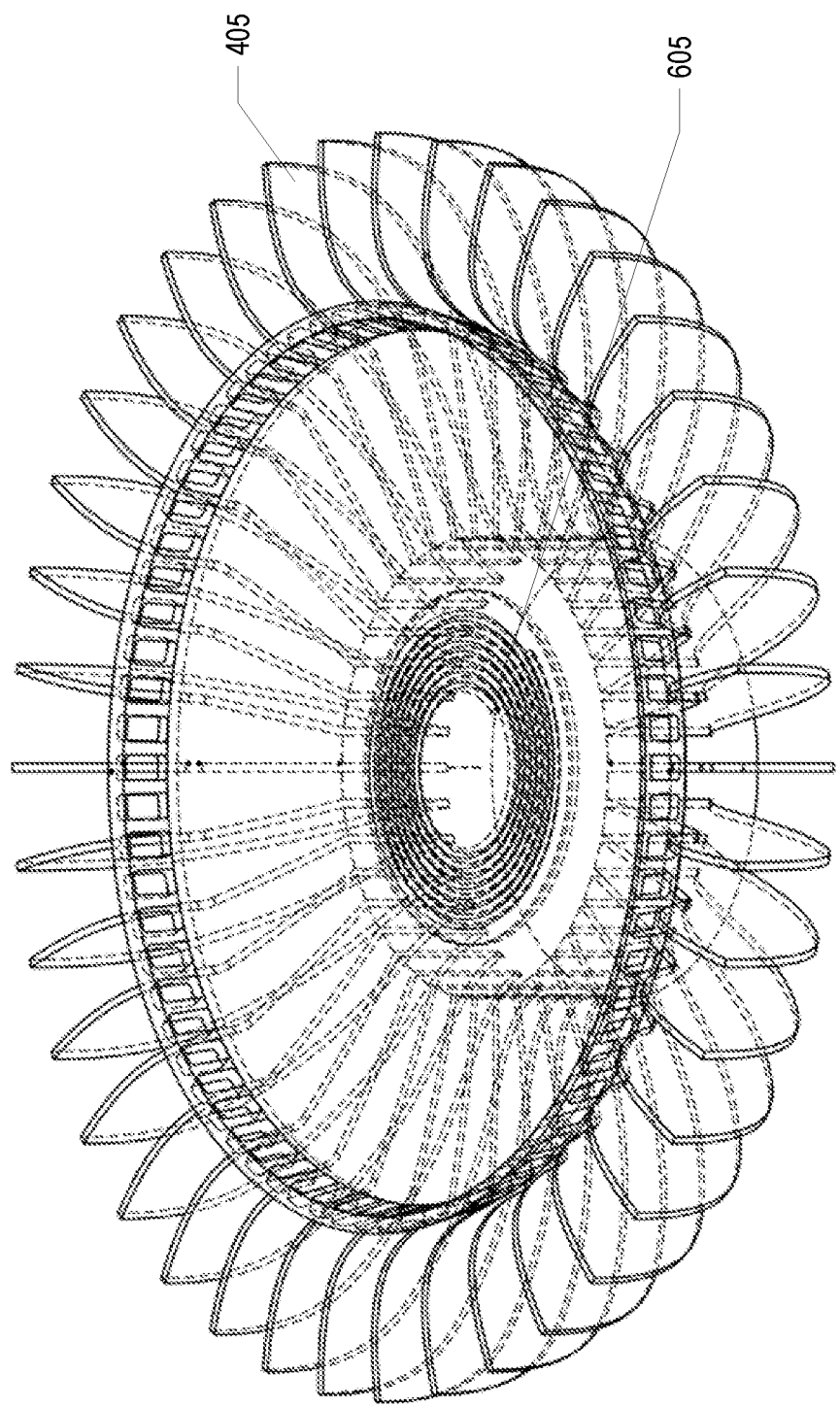
FIG. 14 shows an induction coil sandwiched between the heatsink and the case top roof according to an embodiment.

In an embodiment, the living room convergence device 100 includes an induction coil for inductive charging of an external device, such as a phone. FIG. 14 shows an induction coil 605 sandwiched between the heatsink 405 and the case top roof 340 according to an embodiment. The induction coil 605 may be used for charging an external device, such as a phone, when placed on the living room convergence device 100. The external device would rest on the case top roof 340 and the opposing rim of the case.

Figure 15:
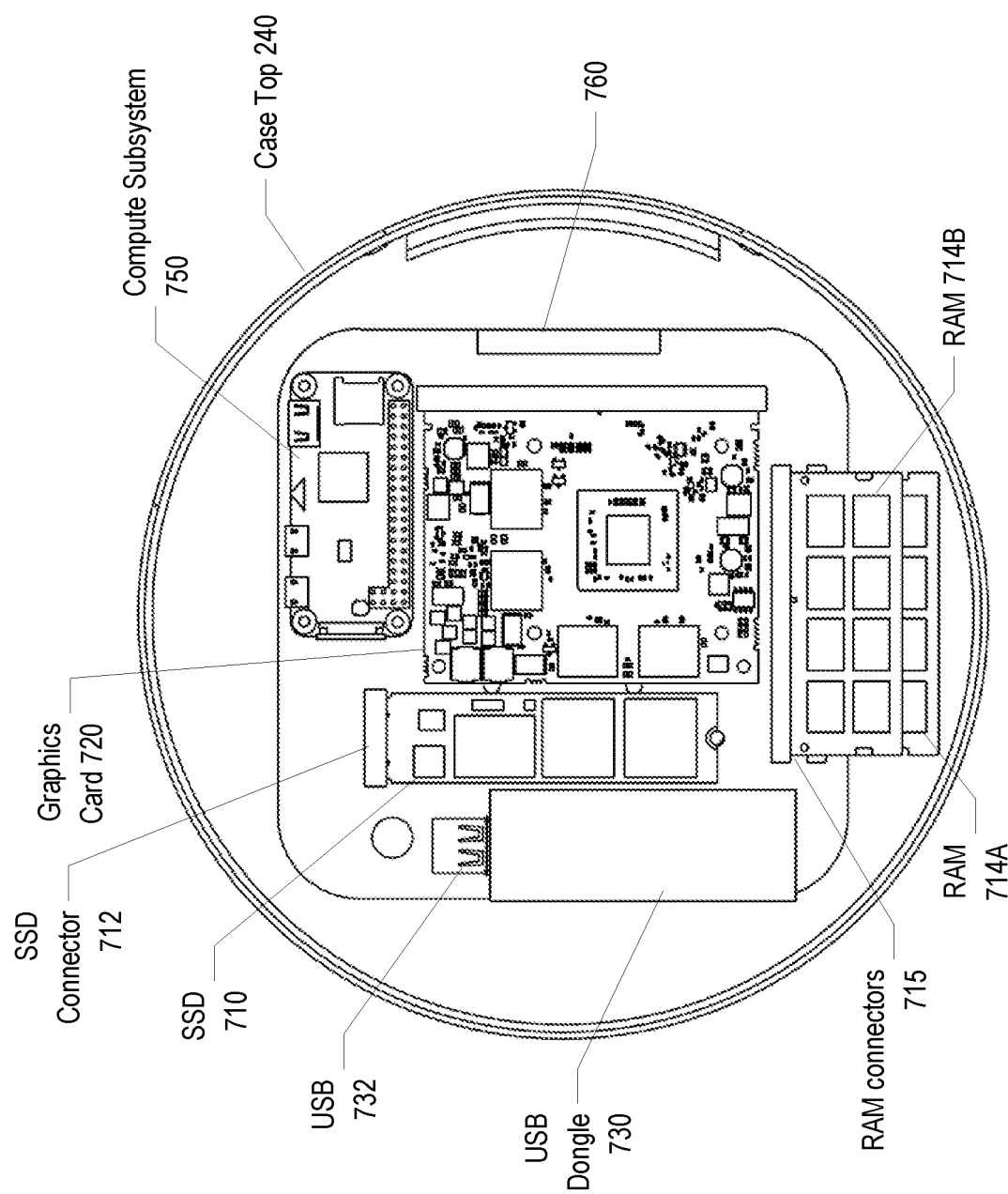
FIG. 15 shows the bottom side of the mainboard of the living room convergence device, with populated connectors, according to an embodiment.

FIG. 15 shows the bottom side of the mainboard 400 of the living room convergence device 100, with populated connectors, according to an embodiment. This view presents itself to users when the bottom of the living room convergence device 100 is removed, and gives access to the upgradable components of the living room convergence device 100. For example, the upgradable components may include one or more of the following: an SSD 710 that connects to the SSD connector 712 (which may be an M.2 SSD connector), RAM 714A-B that connects to the RAM connectors 715 (which may be SO-DIMM), a dedicated graphics card 720 upgrade that fits connects to the connector 722 (which may be a MXM graphics card and MXM connector or a PCIe graphics card and a PCIe connector), and a USB dongle 730 that fits into a USB connector 732. Also shown on this side of the mainboard 400 is a compute subsystem 750 for always-on functionality using the cameras and microphone array and a board-to-board connector 760 that connects to a daughterboard which holds the external connectors that are visible when the bottom is in place (e.g., two USB-C, one HDMI, and one microSD slot).

Although not illustrated, the living room convergence device may include a Wi-Fi router (e.g., a mesh Wi-Fi router) for Wi-Fi connectivity. The living room convergence device may include a cellular radio module (e.g., a 4G LTE advanced or 5G radio module) for cellular connectivity.

Although not illustrated, the living room convergence device 100 may include a suspended mainboard. For instance, the mainboard 400 may be suspended from the roof of the case top 240 and held at multiple touch points. The mainboard 400 may be attached to the case top 240 in several ways (e.g., screwed, glued, fitted, etc.). Suspending the mainboard 400 from the case top 240 dampens the vibration of the living room convergence device 100. For instance, instead of vibration moving through the base of the living room convergence device 100, vibration occurs at substantially the top of the case and then arrives on the bottom, which dampens the vibration.

The suspended mainboard feature may provide a separation into an inaccessible partition and an accessible and upgradeable partition. For instance, the bottom part of the case (the case bottom 215) may be removable thereby providing access to the mainboard and its components. For example, the RAM connectors 715 may be accessible and allow the RAM to be upgraded.

Figure 16:
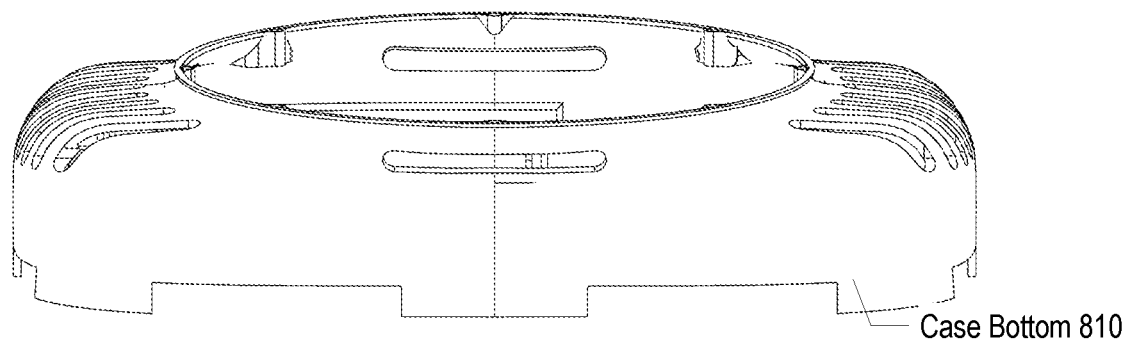
FIG. 16 shows an example of a different case bottom that can be used with the living room convergence device according to an embodiment.
Figure 17:
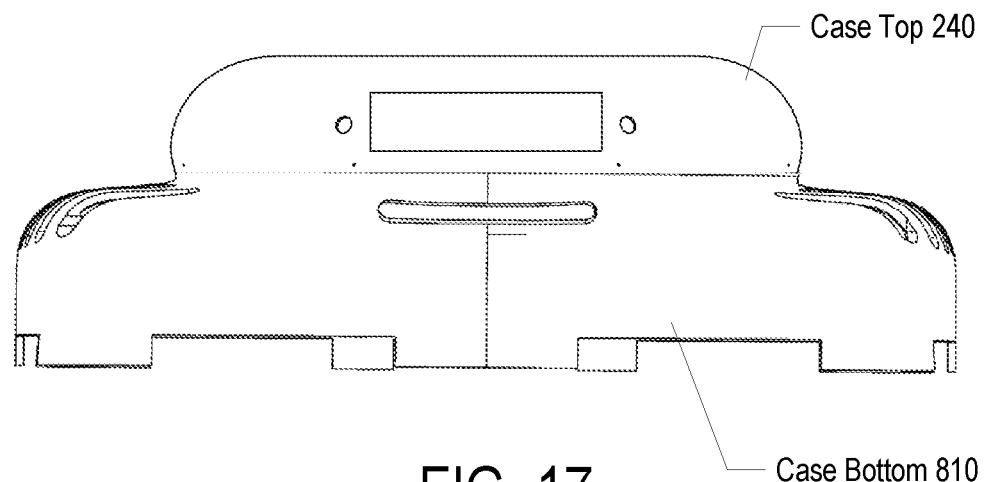
FIG. 17 shows a view of the case bottom of FIG. 16 connected with the case top of the living room convergence device according to an embodiment.

The living room convergence device may include a replaceable case bottom. In an embodiment, there are different replaceable case bottoms with potentially different shapes and/or sizes that can be used. A user and/or a manufacturer may swap out different case bottoms for different needs. For instance, the magnetically-held case bottom can be replaced by a differently-shaped bottom. This allows the device to be changed into an augmented device with new functionality or greater performance FIG. 16 shows an example of a different case bottom 810 that can be used with the living room convergence device 100 according to an embodiment. The case bottom 810 is shaped so that it provides room for a full-size off-the-shelf GPU to be used for the living room convergence device 100. FIG. 17 shows a view of the case bottom 810 connected with the case top 240. The case top 240 and the case bottom 810 may be connected magnetically.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a feature, structure, or characteristic is described in connection with an embodiment, it is submitted that it is within the knowledge of one skilled in the art to affect such feature, structure, or characteristic in connection with other embodiments whether or not explicitly described.

While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. The steps of any methods disclosed herein do not have to be performed in the exact order disclosed, unless a step is explicitly described as following or preceding another step and/or where it is implicit that a step must follow or precede another step. Any feature of any of the embodiments disclosed herein may be applied to any other embodiment, wherever appropriate. Likewise, any advantage of any of the embodiments may apply to any other embodiments, and vice versa. Other objectives, features and advantages of the enclosed embodiments will be apparent from the following description.

ABBREVIATIONS

At least some of the following abbreviations may be used in this disclosure. If there is an inconsistency between abbreviations, preference should be given to how it is used above. If listed multiple times below, the first listing should be preferred over any subsequent listing(s).

APU Advanced Processing Unit (a combination of a GPU and a CPU)
CPU Central Processing Unit
GPU Graphics Processing Unit
VPU Vision Processing Unit, a specialized processor for Computer Vision
HW Hardware
MXM Mobile PCI Express Module
PCBA An assembled (populated) printed circuit board
PCIe Peripheral Component Interconnect Express
RAM Random Access Memory
SO-DIMM Small outline dual in-line memory module
SSD Solid-state drive
STB Set-top box
TDP Thermal design power

What is claimed is:

1. A living room convergence device, comprising: a case including, a bottom portion that includes a plurality of air intake holes, and a top portion that includes a plurality of air exhaust holes; a mainboard; a central processor; and a thermal solution including: a heatsink sitting atop the mainboard of the living room convergence device, the heatsink to dissipate heat from the central processor, and a fan assembly including rotating fan blades and a motor that drives the rotating fan blades, creating a bottom-to-up swirling airflow starting from the plurality of air intake holes and exiting through the plurality of air exhaust holes, wherein the motor drives a fan belt around a ring holding the rotating fan blades to cause the rotation of the rotating fan blades; wherein a ratio of radii between the rotating fan blades and the ring permits slow rotation speeds as compared to a direct-drive fan.

2. The living room convergence device of claim 1, further comprising:
one or more expansion slots.

3. The living room convergence device of claim 1, further comprising:
a microphone array.

4. The living room convergence device of claim 1, wherein the rotating fan blades of the thermal solution are shaped to scoop air up from the plurality of air intake holes and push upwards to the plurality of air exhaust holes.

5. The living room convergence device of claim 1, wherein the rotating fan blades of the thermal solution cause lateral air flow over the heatsink.

6. The living room convergence device of claim 1, wherein the heatsink is cradled within the rotating fan blades.

7. The living room convergence device of claim 1, further comprising:
an always-on compute subsystem with a Vision Processing Unit (VPU), and camera and microphone interfaces.

8. The living room convergence device of claim 1, further comprising:
an induction coil for inductive charging of an external device.

9. The living room convergence device of claim 1, further comprising:
a display.

10. The living room convergence device of claim 9, wherein the display is a horizontally-bendable display.

11. The living room convergence device of claim 1, further comprising:
a Wi-Fi router.

12. The living room convergence device of claim 1, further comprising:
a radio module.

13. The living room convergence device of claim 1, wherein the mainboard is suspended from the top portion of the case.

14. The living room convergence device of claim 1, wherein the bottom portion of the case is replaceable.

15. The living room convergence device of claim 1, wherein the bottom portion of the case is removable to allow access to one or more components of the mainboard.

16. The living room convergence device of claim 1, further comprising:
a rubber foot ring connected to the bottom portion of the case; and
a rubber ring between the bottom portion of the case and the top portion of the case.

17. The living room convergence device of claim 1, wherein the bottom portion of the case and the top portion of the case are magnetically connected.

* * * * *